United States Patent [19]

Vanhecke

[11] Patent Number: 5,216,384
[45] Date of Patent: Jun. 1, 1993

[54] PROGRAMMABLE AMPLIFIER DEVICE
[75] Inventor: Claude Vanhecke, Toulouse, France
[73] Assignee: Alcatel Espace, Courbevoie, France
[21] Appl. No.: 886,162
[22] Filed: May 21, 1992
[30] Foreign Application Priority Data May 24, 1991 [FR] France ................. 91 06276

[51] Int. Cl.[5] ............................ H03G 3/10
[52] U.S. Cl. ..................... 330/279; 330/133; 330/134
[58] Field of Search ............ 330/129, 131, 133, 134, 330/278, 279, 310

[56] References Cited

U.S. PATENT DOCUMENTS 4,213,097  7/1980  Chiu et al. ............... 330/279 X
4,554,511  11/1985  Braun .................... 330/129 X

FOREIGN PATENT DOCUMENTS 2251126  6/1975  France .
2291642  6/1976  France .
2304125  10/1976  France .

OTHER PUBLICATIONS

Neues aus der Technik, No. 1, Feb. 15, 1990, Wurzburg, Germany, p. 4; "Digital arbeitender Lautstarkeregler in einem Mehrstufenverstarker."
IBM Technical Disclosure Bulletin, vol. 14, No. 9, Feb. 1972, New York, US, pp. 2639–2640; D. Millican: "Four-level gain control stage."

Primary Examiner—Steven Mottola
Attorney, Agent, or Firm—Sughrue, Mion, Zinn, Macpeak & Seas

[57] ABSTRACT

An amplifier device has a gain programmable between $2^n$ and $2^{n-1}$ in steps of $2^p$ where $p<n$ and $n$ is the number of gain control bits. The device comprises a plurality of stages having two gain values selectable by a control bit and at least two identical stages having a different control bit. Each stage has a maximum gain less than $2^{n-1}$.

5 Claims, 3 Drawing Sheets

PROGRAMMABLE AMPLIFIER DEVICE

BACKGROUND OF THE INVENTION

1. Field of the Invention

The invention concerns a programmable amplifier which can be integrated in the form of an analog ASIC (Application Specific Integrated Circuit) for amplification applications in the field of space telecommunications.

An object of the device in accordance with the invention is to enable amplification with a gain between $2^n$ and $2^{n-1}$ in steps of $2^p$ where $p<n$ and n is the number of gain control bits.

2. Description of the Prior Art

A conventional solution to obtaining amplification as defined hereinabove implemented in the form of an ASIC is to use an amplifier associated with a programmable attenuator such as that described in the article "Programmable attenuator" by A. A. Shakhin and A-Ya. Stul (1979, Plenum publishing corporation). However, various problems specific to integrated circuits are then encountered concerning:

accuracy of resistor values;
bandwidth;
switching components.

Resistor values are difficult to control in ASICs. The accuracy that can be achieved in the absolute resistance value is around ±25%, compared with a possible accuracy of 1% in discrete resistors. Also, it is not possible to use capacitor values exceeding a few dozen picofarads (pF).

An alternative solution is to use a plurality of amplifiers connected in cascade; the first amplifier has a high gain to obtain the best possible signal/noise ratio. The bandwidth is then significantly reduced, however.

An object of the invention is to provide a programmable amplifier device of this kind which has very good:

bandwidth;
noise factor;
compression;
transistor matching.

SUMMARY OF THE INVENTION

The present invention consists in an amplifier device having a gain programmable between $2^n$ and $2^{n-1}$ in steps of $2^p$ where $p<n$ and n is the number of gain control bits, said device comprising:

a plurality of stages having two gain values selectable by a control bit, and at least two identical stages having a different control bit, each stage having a maximum gain less than $2^{n-1}$.

The device advantageously comprises an input stage which has a fixed gain and amplification stages which have two switchable gain values, an output matching stage and two current regulator circuits enabling use of a current variation law enabling compensation of variations in the gain of the various stages, a first circuit being always enabled and the second circuit being controled by an On/Off control signal.

Two identical amplification stages are advantageously provided at the center of the string of amplifier stages. The input stage comprises two branches in parallel between the supply voltage and ground, each branch comprising in series a resistor, a transistor, two transistors in parallel receiving a signal delivered by the first current regulator circuit and two resistors at the common point of which is an input point.

Each switchable gain amplifier stage comprises two branches in parallel each comprising a resistor, a first transistor and a twin-emitter second transistor, the two branches being connected to two inputs of a switching circuit through two resistors and the switching circuit being grounded through a third transistor which receives a signal from the second current regulator circuit operating as a direct current generator, input interface circuits respectively connected to the base of each twin-emitter second transistor enabling level conversion for cascading the stages and a voltage comparator circuit which receives a signal from the first current regulator circuit enabling the stage gain to be selected.

A device of this kind can meet the above-defined gain, bandwidth and noise factor objectives. The noise factor in particular is strongly enhanced for low gain values. The gain of the resulting amplifier can be varied in steps of 1 dB, the resulting gain×bandwidth product being very good (60 GHz). Good isolation is achieved (60 dB).

Advantageously there is no need to use DC feedback which would modify the gain.

The use of a device of this kind in the form of an ASIC enables excellent temperature compensation to be achieved. This is because all the circuits are implemented in a symmetrical form.

Given that the stages are all implemented with identical components, except for the resistors, and even though the stages are cascaded a good variation of gain is achieved, although there is some gain offset.

Groups of resistors in parallel-series arrangements can advantageously be used to obtain more accurate resistor values.

The features and advantages of the invention will emerge from the following description given by way of non-limiting example only with reference to the appended drawings.

DETAILED DESCRIPTION OF THE INVENTION

Figure 1:
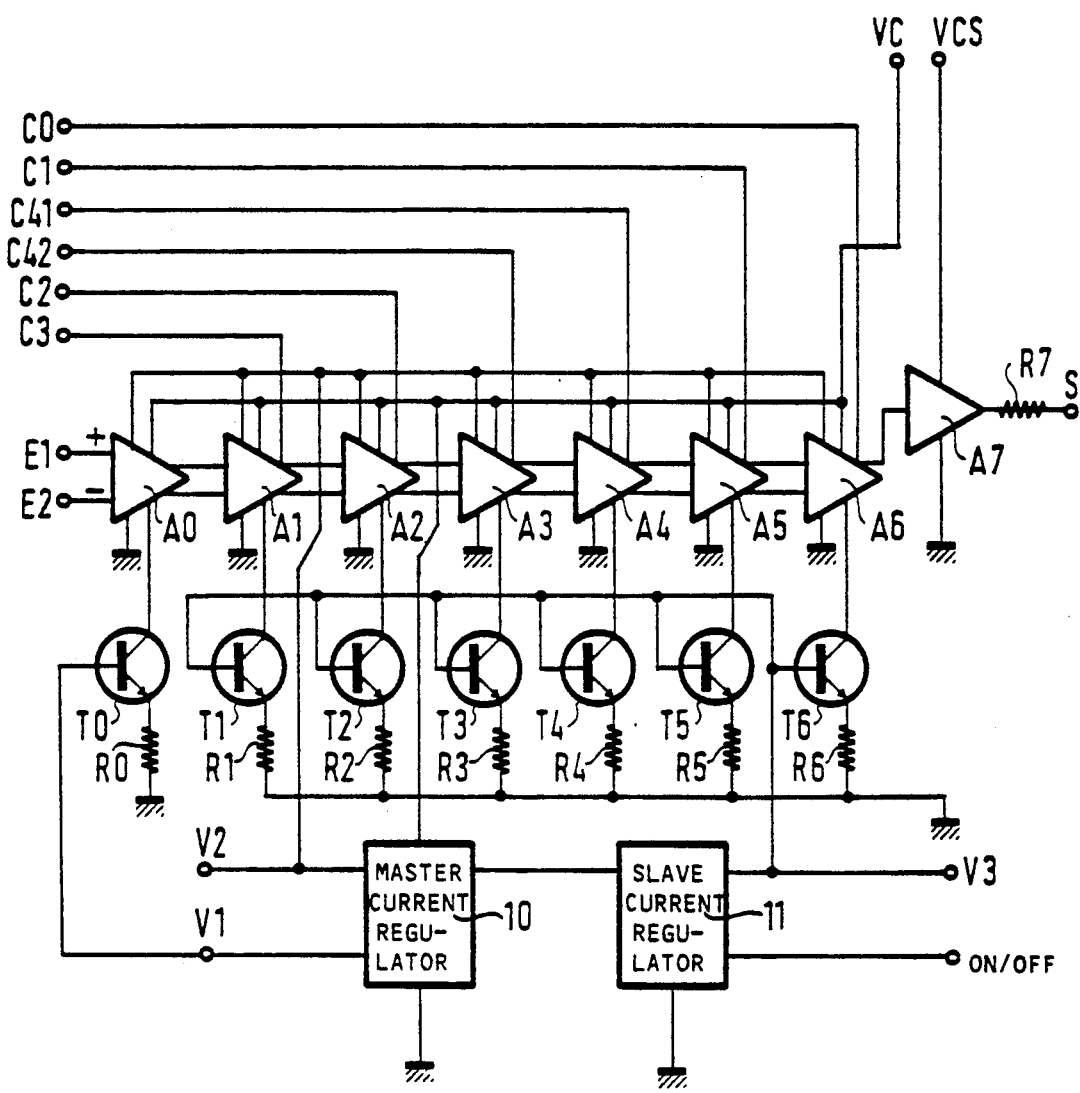
FIG. 1 shows one embodiment of a device in accordance with the invention.

Referring to FIG. 1, a device in accordance with the invention comprises seven amplifier stages A0, A1, A2, A3, A4, A5, A6 each having two inputs and two outputs enabling symmetrical mode operation.

Each of the stages A0 through A6 is connected between a supply voltage VC and ground.

The stages A1 through A6 have two gain values switchable by means of an external control bit $C_i$: in this instance the respective bits C3, C2, C42, C41, C1 and C0. The first stage A0 has a fixed gain, however. Two stages have exactly the same gain, the stages A3 and A4, for example.

An output of the stage A6 is connected to an output matching stage A7 followed by a resistor R7 which has a value of 50 ohms, for example.

Figure 3:
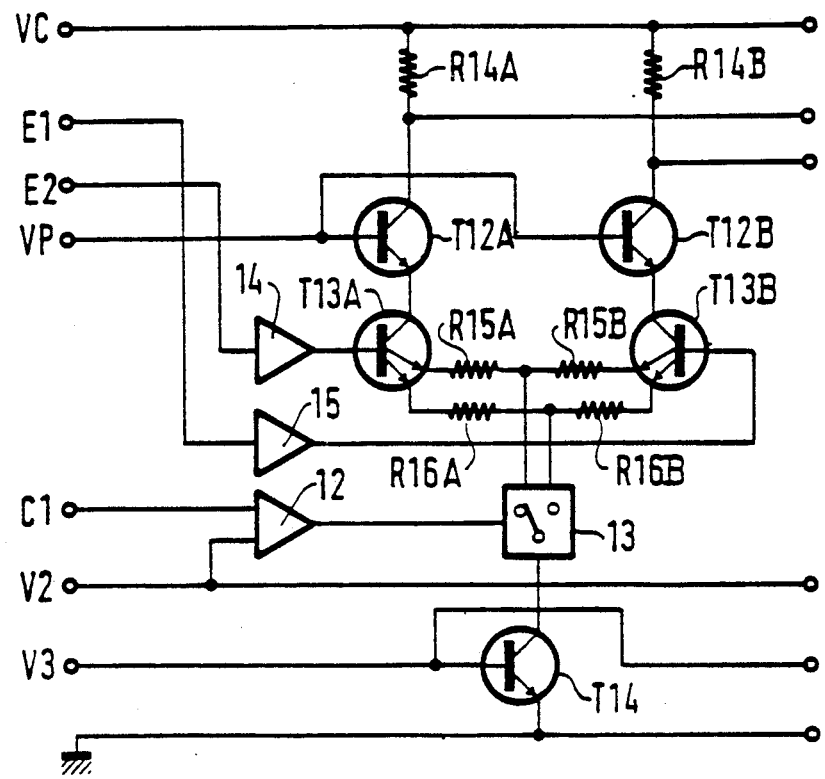

Transistors T0 through T6 each grounded through a resistor R0 through R6 provide temperature compensation for variation in the gain of each of the stages A0 through A6 by supplying an appropriate voltage. Two current regulator circuits 10 and 11 of the band gap type, for example, enable use of a current variation law enabling this temperature compensation for variation in the gain of the various stages. The first of the two circuits is called the "master" and the second is called the "slave". The master circuit 10 generates a signal V2 providing a reference voltage for the input stage A0 and threshold voltages for the comparator circuits 12 included in the stages A1 through A6 as shown in FIG. 3. The circuit 10 is always enabled.

The slave circuit 11 generates a signal V3 providing a voltage reference for the stages A1 through A6 and controling the current generators of these stages, which are the transistors T14 shown in FIG. 3. This circuit can be disabled by the On/Off control signal. In this case the stages A1 through A6 are no longer energized. They therefore no longer operate; this enables the inputs E1, E2 to be isolated from the output S. The input and output impedances are maintained at 50 ohms, however, because the stages A0 and A7 are still energized.

In an advantageous embodiment the device is implemented in the form of an ASIC. The various stages can have the following gains:

A0: 18 dB,
A1: 8 dB or 0 dB,
A2: 4 dB or 0 dB,
A3=A4: 13 dB or −3 dB,
A5: 2 dB or 0 dB,
A6: 1 dB or 0 dB.

Logically, the various stages A0 through A6 should have the respective gains (32 dB/0 dB), (16 dB/0 dB), (8 dB/0 dB), (4 dB/0 dB), (2 dB/0 dB), (1 dB/0 dB), the highest gain being placed first in the sequence to achieve a good noise factor. A structure of this kind has various drawbacks, however: the first is that a first stage of this kind (32 dB) would have too restricted a bandwidth (100 MHz); the second is that in the 0 dB position of this stage the conditions of high gain at the input of the string would no longer be complied with. There would also be a risk of HF oscillation (possible total gain of 60 dB).

In a device in accordance with the invention, however, such as that shown in FIG. 1, the stage A0 has a fixed gain to improve the overall noise factor. The gain and the frequency of this stage are optimized. The gain of this stage compensates the attenuation introduced by the stages A3 and A4 (−6 dB) and by the stage A6 which is due to the change from the symmetric mode at its input to an asymmetric mode at the input of the output stage A7, and by impedance matching between this stage A7 and the output load, which is 50 ohms, for example.

The identical stages A3 and A4 are here disposed in the middle of the cascade to achieve a compromise on noise at the various gain values.

With the gain values specified above, a device of this kind can provide a maximum asymmetric output gain of 47 dB with six control bits as shown in table I at the end of this description. The expression "5½ bit" control could be used because, to achieve the specified performance, this device has a maximum gain greater than the maximum gain obtained with five external control bits but less than the maximum gain obtained with six bits.

This device therefore has a gain between $2^n$ and $2^{n-1}$ where n is the number of gain control bits. Each stage, including the input stage, has a maximum gain less than $2^{n-1}$. In the example considered above, excepting the stage A0 which has a specific role, the maximum gain of the stages A1 through A6 is 13 dB which means that it is possible to achieve a bandwidth of 440 MHz for the 13 dB stage.

Figure 2:
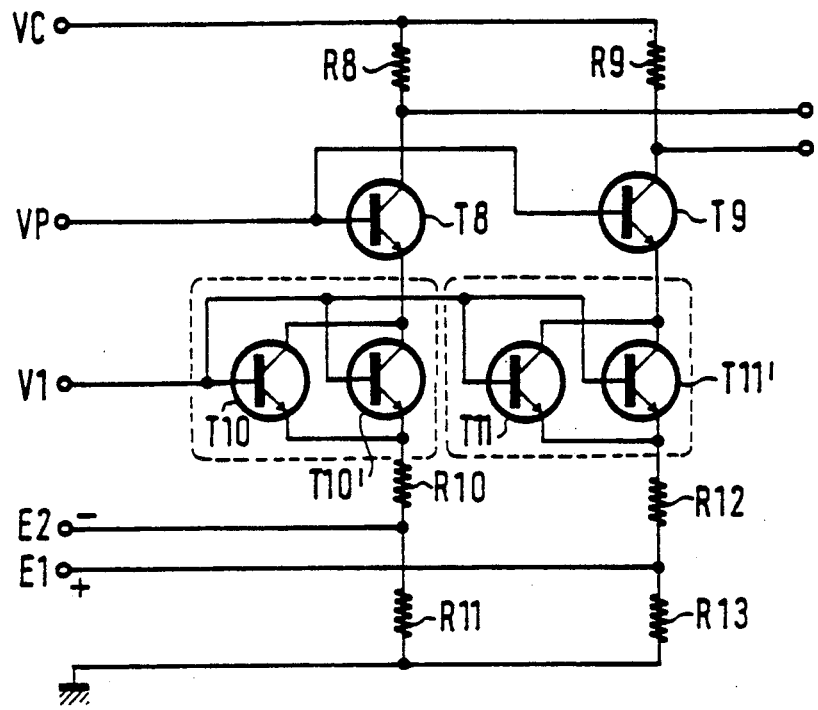
FIGS. 2 and 3 show two embodiments of the circuit of this device in accordance with the invention.

FIG. 2 shows one embodiment of the input stage A0. It comprises two branches in parallel between the supply voltage VC and ground, each branch comprising in series a resistor R8 (R9), a transistor T8 (T9) receiving on its base a DC bias voltage VP, two transistors in parallel T10, T10' (T11, T11') and two resistors R10 and R11 (R12 and R13).

The structure is optimized to obtain the best possible frequency response (bandwidth) and the best possible noise factor and to minimize the effect on the stage DC offset of the matching required between the transistors.

The transistors T10 and T11 are selected for their low resistance rbb' and their low emitter resistance RE; these values are further reduced by duplicating the transistors (transistors T10 and T10' in parallel; transistors T11 and T11' in parallel) which also improves the matching between the transistors T10 and T11.

The transistors T10 (T10') and T11 (T11') operate as direct current generators for the transistors T8 and T9 producing currents which vary with temperature in a manner appropriate to maintaining a constant stage gain. This is achieved by applying a band gap voltage of 1.2 V to the bases of the transistors T10 and T11.

The transistors T10 (T10') and T11 (T11') are in a voltage-controled common-base circuit; this is to optimize the frequency response. Frequency limitations are essentially due to:
the base resistance rbb':
the collector-substrate capacitance Cjs and the collector-base capacitance Cjc. The load for the transistors is the dynamic resistance re of the transistors T8 and T9 which is low (24 ohms, for example). This effect is therefore limited.

A voltage-controled common-base circuit suffers from high noise because the noise generated by the resistances rbb' and RE and the collector current IC find a path through the source itself. However, the transistors T10 (T10') and T11 (T11') are followed by transistors T8 and T9 also in a common-base circuit. The higher value load resistors R8 and R9 of these transistors (having a value of 567 ohms, for example) are necessary to achieve the stage gain. The frequency effects of the capacitances Cjs and Cjc are greater and require the use of faster transistors, for example transistors of the QN1 type whose specifications are set out in table II at the end of this description. These transistors are current-controled and the source therefore has a high internal resistance. The noise generated by the resistances rbb' and RE and the collector current no longer finds a path and remains inactive. The only output noise is that generated by the base current.

Finally, the resistors R10 and R12 associated with the emitter resistance RE and the dynamic resistance re of the transistors T10 (T10') and T11 (T11') provide an input impedance of 50 ohms and improve the linearity of the input stage. To a first approximation, the gain of this stage is the ratio of the resistor R8 (or R9) and the sum of the resistor R10 (R12) and (RE+re+(rbb'/BETA)) for the transistors T10 and T11. This yields a bandwidth of approximately 820 MHz and a noise factor of 7.9 dB as compared with 560 MHz and 11 dB for a common-base QN1 type transistor.

This circuit, shown in FIG. 2, eliminates the noise of the transistors T8 and T9 by reducing the parasitic collector/substrate capacitances. The result is an amplifier which has very low noise for an integrated circuit with a high compression point (and therefore good linearity) and a wide bandwidth.

FIG. 3 shows one embodiment of the variable gain stages A1 through A6. Each such stage comprises two branches in parallel each comprising a resistor R14A (R14B), a transistor T12A (T12B) and a twin-emitter transistor T13A (T13B), the two branches being connected to the inputs of a switching circuit 13 through two resistors R15A and R16A (R15B and R16B), the switching circuit being grounded through a transistor T14 operating as a direct current generator.

Input interface circuits 14, 15 provide level conversion for cascading the stages. The circuit 12 is a voltage comparator for selecting the stage gain. The transistor T14 provides temperature compensation for the stage gain.

The transistors T13A and T13B, the resistors R15A, R15B, R16A and R16B provide two different gain values selected by switching the current supply by means of the circuit 13:

with the components T13A, T13B, R15A, R15B a minimum gain is obtained, for example;
with the components T13A, T13B, R16A, R16B a maximum gain is obtained.

The transistors T12A and T12B limit the effects of the capacitances of the transistor T13A and T13B (Cjs and Cjc). These transistors T12A and T12B do not contribute to improving the noise factor of the stage.

The stage gain, the ratio between the load resistors R14A and R14B and the sum of the resistors R15A, R15B (or R16A, R16B) and the sum (RE+re+(rbb'/BETA)) for the transistors T13A or T13B and the high values of the resistors R15A, R15B, R16A and R16B relative to the emitter resistances RE provide a better solution to the DC offset problem.

In one embodiment such as that shown in FIGS. 1, 2 and 3 a device in accordance with the invention is implemented in the form of an analog ASIC using bipolar technology. The resistors are chosen to obtain the best accuracy in respect of the gain of each stage given the limited choice of "semi-custom" layout techniques. The complete circuit diagram comprises 181 transistors, 316 resistors and 1 capacitor. In the layout:

The input and output stage grounds are separated to avoid any possibility of loop back due to the resistance and the self-inductance of the connecting wires.

The supply voltages VC and VCS are separated: all the "islands" of the resistors are connected to the voltage VC rather than the voltage VCS to avoid looping of signals on the VCS line to ground due to the island-substrate capacitance and the connecting wires. This would otherwise cause HF oscillation at high values of gain and poor input-output isolation in the off state.

Despite the high gain no direct current feedback system is used, firstly to retain good HF characteristics and secondly because high value resistors have been incorporated into the emitters of the transistors to improve matching. At the current values employed (1.2 mA, for example) transistor matching depends on the emitter resistance RE. This resistance also contributes to defining the gain, a circuit with a good gain having a good DC offset.

The resistor values are all less than 1 kilohm. They are chosen to optimize matching.

A device of this kind advantageously implements an amplification function in the VHF band with the gain programmable between 0 dB and 47 dB in steps of 1 dB. The noise factor and the compression point, which represents a 1 dB downward offset of the output signal/input signal transfer function relative to an ideal straight line, are very good. The input and output impedance are 50 ohms. The control inputs are TTL and CMOS compatible. Finally, the circuit can be turned off with adequate input/output isolation, the input/output impedances retaining their initial values.

The full-custom design technique is used for the electrical part and the semi-custom technique for the layout.

Figure 4:
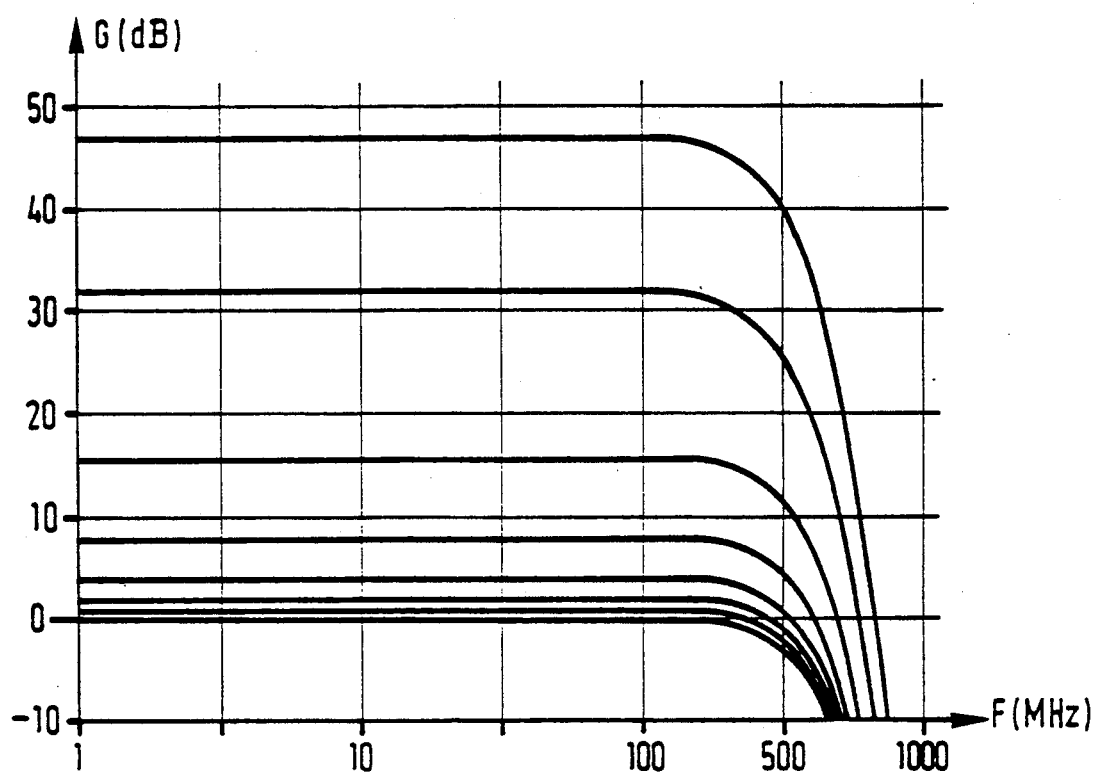
FIG. 4 shows a set of response curves for this device in accordance with the invention.

The results are summarized in table III at the end of this description and the gain-frequency curves are shown in FIG. 4. Note that the bandwidth remains virtually constant whatever the gain. Very satisfactory results have been obtained from samples taken from the first configuration run, namely:

a bandwidth of 270 MHz for a maximum gain of 47 dB, that is a gain×bandwidth product in the order of 60 GHz;
a noise factor of around 10 dB at maximum gain;
a compression in the order of 0 dBM.

Of course, the present invention has been described and shown by way of preferred example only and its component parts could be replaced with equivalent parts without departing from the scope of the invention.

For example, this device in accordance with the invention is implemented in the form of an analog ASIC using bipolar technology to operate at VHF. However, its operating frequency could be increased to a few tens of GHz by using AsGa monolithic technology.

TABLE I

| External control bit | | | | | | Gain adjustments |
|---|---|---|---|---|---|---|
| C0 | C1 | C2 | C3 | C41 | C42 | |
| 0 | 0 | 0 | 0 | 0 | 0 | Reference |
| 1 | 0 | 0 | 0 | 0 | 0 | 1 dB |
| 0 | 1 | 0 | 0 | 0 | 0 | 2 dB |
| 0 | 0 | 1 | 0 | 0 | 0 | 4 dB |
| 0 | 0 | 0 | 1 | 0 | 0 | 8 dB |
| 0 | 0 | 0 | 0 | 1 | 0 | 16 dB |
| 0 | 0 | 0 | 0 | 0 | 1 | 16 dB |
| Other combinations | | | | | | All bits selected |

TABLE II

| | QN1 | QN2 |
|---|---|---|
| Ft (transition frequency) | 2.5 GHz | 2.5 GHz |
| re | 24 ohms | 21 ohms |
| rbb' | 260 ohms | 150 ohms |
| Cjc | 128 fF (1 fF × $10^{-15}$F) | 205 fF |
| Cjs | 150 fF | 230 fF |

TABLE III

| Supply voltage | 5 V |
|---|---|
| Frequency band | 0–270 MHz |
| Direct current | 29 mA |
| Reference gain accuracy | +/−2 dB |
| Gain step accuracy | +/−0.3 dB |
| Noise at maximum gain | 11 dB |
| Input/output isolation | <45 dB |

There is claimed:

1. Amplifier device having a gain programmable between $2^n$ and $2^{n-1}$ in steps of $2^p$ where $p<n$ and n is the number of gain control bits, said device comprising:
an input stage having a fixed gain:
a plurality of amplifier stages having two gain values selectable by a control bit, with at least two of said amplifier stages being identical stages having a different control bit, each stage having a maximum gain less than $2^{n-1}$;
an output matching stage; and
first and second current regulator circuits enabling use of a current variation law enabling amplifier stage gain variations to be compensated, said first circuit being always enabled and said second circuit being controlled by an on/off switching signal.

2. A device according to claim 1 implemented as an application specific integrated circuit.

3. A device according to claim 1 wherein said amplifier stages are connected in cascade and said two identical amplifier stages are disposed in the middle of said plurality of amplifier stages.

4. A device according to claim 1 wherein said input stage comprises two branches in parallel between a supply voltage and ground, each branch comprising in series a resistor, a first transistor, two transistors in parallel receiving a signal delivered by said first current regulator circuit and two resistors a common point of which constitutes an input point.

5. A device according to claim 1 wherein each switchable gain amplifier stage comprises two branches in parallel each comprising a resistor, a first transistor and a twin-emitter second transistor, said two branches being connected to two inputs of a switching circuit through two resistors and said switching circuit being grounded through a third transistor which receives a signal from said second current regulator circuit operating as a direct current generator, input interface circuits respectively connected to the base of each twin-emitter second transistor enabling level conversion for cascading said stages and a voltage comparator circuit which receives a signal from said first current regulator circuit enabling the stage gain to be selected.

* * * * *